United States Patent
Inazawa et al.

(10) Patent No.: US 6,914,183 B2
(45) Date of Patent: Jul. 5, 2005

(54) BOARD FOR PRINTED WIRING

(75) Inventors: Shinji Inazawa, Osaka (JP); Hiroshi Takada, Osaka (JP); Akihisa Hosoe, Osaka (JP); Kouji Nitta, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/669,018

(22) Filed: Sep. 24, 2003

(65) Prior Publication Data

US 2004/0058138 A1 Mar. 25, 2004

(30) Foreign Application Priority Data

Sep. 25, 2002 (JP) ........................................ 2002-279809

(51) Int. Cl.$^7$ ............................................... H05K 9/00
(52) U.S. Cl. ............................... 174/35 R; 174/35 MS
(58) Field of Search ......................... 174/35 R, 35 MS

(56) References Cited

U.S. PATENT DOCUMENTS

| | | | | |
|---|---|---|---|---|
| 5,676,812 A | * | 10/1997 | Kadokura | .................... 205/50 |
| 5,827,445 A | * | 10/1998 | Yoshida et al. | .......... 252/62.54 |
| 6,048,601 A | * | 4/2000 | Yahagi et al. | ............... 428/147 |
| 6,448,491 B1 | * | 9/2002 | Sato et al. | ............. 174/35 MS |
| 6,625,040 B1 | * | 9/2003 | Tuttle | ......................... 361/816 |
| 6,713,671 B1 | * | 3/2004 | Wang et al. | ........... 174/35 MS |

FOREIGN PATENT DOCUMENTS

| | | |
|---|---|---|
| JP | P2001-200305 | 7/2001 |
| JP | P2002-158484 | 5/2002 |

* cited by examiner

*Primary Examiner*—Cathy F. Lam
(74) *Attorney, Agent, or Firm*—McDermott Will & Emery LLP

(57) ABSTRACT

A board for printed wiring comprises an electromagnetic wave absorbing laminate (EM) provided on a surface of a substrate (1) with the intervention of an adhesive layer (2) of a metal oxide, the electromagnetic wave absorbing laminate (EM) comprising: (a) a magnetic layer (3) comprising a plurality of magnetic particles (31) having an average particle diameter of 1 to 150 nm and isolated from each other by an electrically insulative material (32); and (b) an electrically insulative layer (4), being alternately stacked in a multi-layer structure, the board for printed wiring has a reduced thickness and an improved electromagnetic wave absorbing characteristic in a high frequency band of not lower than gigahertz, as compared with a conventional one which has an electromagnetic wave absorbing layer of a composite material including fine magnetic particles simply dispersed in a resin binder.

10 Claims, 2 Drawing Sheets

US 6,914,183 B2

BOARD FOR PRINTED WIRING

TECHNICAL FIELD

The present invention relates to a novel board for printed wiring, which has the function of reducing spurious radiation noise radiated from devices such as mobile phones and mobile computers operative at frequencies in a high frequency band of not lower than gigahertz.

BACKGROUND OF THE INVENTION

In recent years, the utilization of the magnetic loss of a magnetic material has attracted attention for the reduction of spurious radiation noise radiated from devices such as mobile phones and mobile computers operative at frequencies in a high frequency band of not lower than gigahertz.

The mechanism of the absorption of electromagnetic waves (the attenuation of spurious radiation noise) utilizing the magnetic loss of the magnetic material varies depending on a positional relationship between a noise source and the magnetic material. It is known that the generation of a high frequency electric current is suppressed by providing the magnetic material in close proximity to a noise transmission path.

It is also known that the magnitude of an equivalent resistive component occurring in this case depends on the magnitude of a magnetic loss term $\mu''$, which is the imaginary part of the complex permeability $\mu=\mu'-j\mu''$ of the magnetic material and is generally proportional to the magnitude of the magnetic loss term $\mu''$ when the magnetic material has a constant surface area.

One exemplary electromagnetic wave absorber to be used for attenuating the spurious radiation noise by utilizing the aforesaid function of the magnetic material is a composite material prepared by dispersing fine magnetic particles in a binder such as a resin and formed into a predetermined shape such as a sheet shape.

Exemplary electromagnetic wave absorbers composed of such a composite material are disclosed in Japanese Unexamined Patent Publication No. 2001-200305 (Document 1), Japanese Unexamined Patent Publication No. 2002-158484 (Document 2), and "Advanced Technology and Applications of Novel Radio Wave Absorbers" edited by Osamu Hashimoto and published by CMC Co. on Mar. 1, 1999, page 134, lines 6–8, FIG. 1g (Document 3).

However, composite materials currently in practical use provide a small magnetic loss term $\mu''$ on the order of about 5 to 6 in a high frequency band of not lower than gigahertz. Even if an electromagnetic wave absorber sheet having a thickness of about 1 mm is formed of any of these composite materials, the electromagnetic wave absorber sheet is merely capable of shielding about 50 to 60 percent of electromagnetic waves.

With a recent increasing trend toward the size reduction of the devices, the electromagnetic wave absorbers tend to suffer from a space limitation. Hence, there is a demand for an electromagnetic wave absorber which has a much smaller thickness and provides a greater magnetic loss term $\mu''$ in a high frequency band of not lower than gigahertz than the conventional electromagnetic wave absorbers.

To meet the demand, an attempt has been made to increase the content of the magnetic particles in the composite material for improvement of the electromagnetic wave absorbing characteristic.

Further, the inventor of the present invention has contemplated to form an electromagnetic wave absorbing layer of the composite material on a surface of a printed wiring board constituting an internal circuit of any of the aforesaid devices for space saving by thickness reduction.

With a recent increasing trend toward higher output capacities of the devices, there is a requirement for further powerfully absorbing electromagnetic waves in a predetermined frequency range. However, the electromagnetic wave absorbers composed of the conventional composite materials cannot satisfy the requirement.

As the content of the magnetic particles is increased for the improvement of the electromagnetic wave absorbing characteristic, the content of the binder is relatively reduced, and the physical strength and formability of the electromagnetic wave absorber are correspondingly reduced. Therefore, the improvement of the electromagnetic wave absorbing characteristic has limitation.

This is also true for the electromagnetic wave absorbing layer formed on the surface of the printed wiring board. If the content of the binder is too low, the film formability is reduced, making it impossible to form a thin and uniform electromagnetic wave absorbing layer. Further, the strength of the film is reduced after the formation of the film. Therefore, the content of the magnetic particles cannot extremely be increased, so that the improvement of the electromagnetic wave absorbing characteristic has limitation.

SUMMARY OF THE INVENTION

It is an object of the present invention to provide a novel board for printed wiring, which includes an electromagnetic wave absorbing laminate having a reduced thickness and a drastically improved electromagnetic wave absorbing characteristic in a high frequency band of not lower than gigahertz as compared with the conventional electromagnetic wave absorbing layer composed of the composite material.

To achieve the aforesaid object, the inventive board for printed wiring comprises: an adhesive layer of a metal oxide provided on a surface of a substrate; and an electromagnetic wave absorbing laminate provided on the adhesive layer, and said electromagnetic wave absorbing laminate comprising (a) a magnetic layer comprising a plurality of magnetic particles having an average particle diameter of 1 to 150 nm and isolated from each other by an electrically insulative material and (b) an electrically insulative layer, the magnetic layer and the electrically insulative layer being alternately stacked in a multi-layer structure having at least two layers.

According to the present invention, the electromagnetic wave absorbing laminate comprises (a) the magnetic layer and (b) the electrically insulative layer alternately stacked in the multi-layer structure as described above, so that the electromagnetic wave absorbing characteristic in the high-frequency band can drastically be improved.

That is, the multi-layer structure of the electromagnetic wave absorbing laminate makes it possible to suppress an eddy current loss and effectively remove a closure domain as described in page 135 of Document 3. Therefore, the electromagnetic wave absorbing laminate is capable of advantageously absorb the electromagnetic waves in the high frequency band of not lower than gigahertz.

The magnetic particles dispersed in the magnetic layer have an average particle diameter of 1 to 150 nm, and are electrically isolated from each other by the electrically insulative material in the magnetic layer. These facts provide a synergistic effect, allowing the respective magnetic particles to maintain the magnetic property and have a drastically increased electrical resistivity.

This is because the average particle diameter of the magnetic particles is in the range of 1 to 150 nm, which is close to the mean free path of electrons. Reduction in electrical resistivity which may otherwise occur when two or more of the magnetic particles contact each other to virtually increase the particle diameter can be prevented by electrically isolating the magnetic particles from each other by the electrical insulative material.

The electromagnetic wave absorbing laminate can effectively absorb and attenuate the electromagnetic waves while maintaining a high permeability without loosing the magnetic property in the high frequency band of not lower than gigahertz. When an inductive current occurs within the magnetic particles by a high frequency magnetic field and electric field, magnetization associated therewith can be damped, whereby the electromagnetic waves can efficiently be absorbed and attenuated.

The reduction of the particle diameters of the magnetic particles and the electrical isolation of the respective magnetic particles by the electrically insulative material provide a synergistic effect, whereby deterioration of the permeability characteristic can be prevented which may otherwise occur due to displacement current attributable to the multilayer structure.

The electromagnetic wave absorbing laminate having the aforesaid structure has a drastically improved electromagnetic wave absorbing characteristic in the high frequency band of not lower than gigahertz as compared with the conventional electromagnetic wave absorbing layer composed of the composite material prepared simply by dispersing the magnetic particles in the binder.

Therefore, the inventive board for printed wiring is highly effective for prevention of cross talk of mobile phones to provide countermeasures against EMI (electromagnetic interference which is a noise caused by spurious radiation or electromagnetic waves).

The simplest structure of the magnetic layer of the electromagnetic wave absorbing laminate is such that the plurality of magnetic particles are distributed within a plane without overlapping in the direction of the thickness of the magnetic layer. In this case, the magnetic layer has a thickness which is slightly greater than the diameters of the magnetic particles, more specifically, on the order of submicron.

Also the electrically insulative film may have the thickness enough that the magnetic layers disposed on upper and lower sides of the electrically insulative layer can assuredly be isolated from each other, more specifically, on the order of submicron.

Thus, the electromagnetic wave absorbing laminate is of the multi-layer structure having two or more layers, but has a very small thickness.

Therefore, the inventive board for printed wiring is obtained by combining the electromagnetic wave absorbing laminate having a reduced thickness with the substrate and, hence, is excellent in space saving.

Further, the electromagnetic wave absorbing laminate is formed on the adhesive layer of the metal oxide provided on the surface of the substrate and, hence, has high adhesion to the substrate.

Where the surface of the substrate is composed of a resin such as a polyimide resin, a polyamideimide resin or an epoxy resin, it is difficult to bond the magnetic layer containing the magnetic particles to the surface of the substrate because of the presence of organic functional groups. Where the surface of the substrate is composed of a metal such as stainless steel, it is also difficult to bond the magnetic layer to the surface of the substrate because of the presence of an unstable self-oxide film.

On the contrary, the adhesive layer of the metal oxide is excellent in adhesion to the organic polymer surface and the metal surface of the substrate and in adhesion to the magnetic particles in the magnetic layer.

Thus, the intervention of the adhesive layer improves the adhesion of the magnetic layer to the substrate and, hence, the adhesion of the electromagnetic wave absorbing laminate to the substrate.

Therefore, the inventive board for printed wiring is excellent in durability, because the electromagnetic wave absorbing laminate thereof having the aforesaid complex multi-layer structure has an improved adhesion and is less liable to be separated.

The magnetic particles contained in the magnetic layer are preferably composed of at least one metal selected from the group consisting of Fe, Co and Ni or the oxide of said metal.

Where the magnetic particles are composed of any of these soft magnetic materials excellent in magnetic property, the magnetic layer has an increased saturation magnetic flux density. Therefore, the electromagnetic wave absorbing characteristic of the electromagnetic wave absorbing laminate can further be improved.

The magnetic layer is preferably formed by binding a plurality of composite particles prepared by coating the magnetic particles with electrically insulative films.

With this arrangement, the magnetic particles are assuredly isolated from each other by the electrically insulative films covering the surfaces of the magnetic particles in the magnetic layer. Therefore, the electromagnetic wave absorbing characteristic of the electromagnetic wave absorbing laminate can further be improved.

The electrically insulative films are preferably composed of the oxide of at least one metal selected from the group consisting of Si, Al, Ti and Zr, an amine derivative, an alkanethiol derivative or a resin.

Where the electrically insulative films are composed of any of these materials excellent in electrically insulative property, the magnetic particles can assuredly be isolated from each other. Therefore, the electromagnetic wave absorbing characteristic of the electromagnetic wave absorbing laminate can further be improved, for example, by increasing the filling density of the magnetic particles.

The electrically insulative films preferably have a covering ratio of 10 to 50 vol % based on the total amount of the composite particles.

If the covering ratio of the electrically insulative films is smaller than 10 vol %, the effect of isolating the magnetic particles from each other by the electrically insulative films may be insufficient. If the covering ratio of the electrically insulative films is greater than 50 vol %, the amount of the magnetic particles is relatively reduced and, hence, the filling ratio of the magnetic particles in the magnetic layer is reduced.

With the covering ratio of 10 to 50 vol %, on the contrary, the magnetic particles can assuredly be isolated from each other by the electrically insulative films without reducing the filling ratio of the magnetic particles in the magnetic layer.

The magnetic layer is preferably formed by binding the plurality of composite particles by a binder.

With this arrangement, the strength of the magnetic layer and, hence, the strength of the electromagnetic wave absorbing laminate can be enhanced.

The adhesive layer is preferably composed of at least a Ti containing metal oxide.

The Ti containing metal oxide for the adhesive layer is excellent in adhesion to the magnetic particles and stability, so that the adhesion of the electromagnetic wave absorbing laminate to the substrate can further be improved.

The adhesive layer preferably has a thickness of 3 to 150 nm.

If the thickness of the adhesive layer is smaller than 3 nm, the effect of improving the adhesion of the electromagnetic wave absorbing laminate to the substrate by the provision of the adhesive layer may be insufficient. If the thickness of the adhesive layer is greater than 150 nm, an internal stress of the layer is increased and, hence, the adhesive layer is liable to suffer from distortion and cracking.

On the contrary, if the thickness of the adhesive layer is in the range of 3 to 150 nm, the distortion and cracking are suppressed, and the adhesion of the electromagnetic wave absorbing laminate to the substrate can sufficiently be improved.

The electrically insulative layer is preferably composed of the oxide of at least one metal selected from the group consisting of Si, Al, Ti and Zr, or a curable resin.

Where the electrically insulative layer is composed of any of these materials having an excellent electrically insulative property, magnetic layers disposed on upper and lower sides of the electrically insulative layer can assuredly be isolated from each other. Therefore, the total thickness of the electromagnetic wave absorbing laminate can be reduced by reducing the thickness of each of the electrically insulative layers as much as possible.

The electromagnetic wave absorbing laminate has a complex permeability $\mu$ having a real part $\mu'$ and an imaginary part $\mu''$ which satisfy a relationship $\mu'>\mu''$ in a predetermined frequency range within a high frequency band up to 2 GHz.

With this arrangement, the inventive board for printed wiring is effective not only for the EMI measures but also for SAR (specific absorption rate) measures.

Recently, there is a fear that magnetism from antennas and RF transmitters of mobile communication devices such as mobile phones adversely affects human bodies. When a person makes a phone call with a mobile phone in contact with his ear, for example, a high frequency magnetic component from an antenna of the mobile phone causes an eddy current in his brain. Thus, the human bodies suffer from various adverse effects (e.g., generation of heat in the brain by the eddy current).

For the protection of the human bodies from the adverse effects of the high frequency magnetic field, the SAR measures should be taken for reducing the SAR, i.e., the amount of energy absorbed by a unit mass of human tissues per unit time when the human body is exposed to the electromagnetic wave (more specifically, the mean value of energy absorbed by 10 g of tissues of a portion of the human body for 6 minutes).

A specific example of the SAR measures is to provide a material having a high complex permeability $\mu$ even in the high frequency band to deform the configuration of the high frequency magnetic field radiated from the device so as to converge the magnetic field on the electromagnetic wave absorbing laminate for reduction of the amount of the electromagnetic waves radiated on the human body.

Of the effective parts of the complex permeability $\mu$, the real part $\mu'$ is contributable to the increase of the complex permeability $\mu$ and to the deformation of the configuration of the high frequency magnetic field for the convergence of the magnetic field on the electromagnetic wave absorbing laminate, but not contributable to a magnetic loss. On the other hand, the imaginary part $\mu''$ is contributable to the magnetic loss because of a time lag with respect to an external magnetic field. Therefore, the real part $\mu'$ of the complex permeability $\mu$ is preferably greater than the imaginary part $\mu''$ in the predetermined frequency range of the device within the high frequency band up to 2 GHz. That is, the real part $\mu'$ and the imaginary part $\mu''$ preferably satisfy the aforesaid relationship $\mu'>\mu''$.

Where the real part $\mu'$ and the imaginary part $\mu''$ satisfy a relationship $\mu'\leq\mu''$, on the other hand, the imaginary part $\mu''$ should excessively be increased in order to increase the complex permeability $\mu$. Accordingly, the loss is excessively increased, thereby reducing the output of the electromagnetic waves to be radiated from the antenna. Therefore, communications per se may be obstructed.

On the contrary, where the real part $\mu'$ and the imaginary part $\mu''$ satisfy the relationship $\mu'>\mu''$ in the predetermined frequency range of the device within the high frequency band up to 2 GHz, the complex permeability $\mu$ can be increased without the reduction of the output of the electromagnetic waves radiated from the antenna. Thus, the magnitude of the high frequency magnetic field radiated on the human body can be reduced.

DETAILED DESCRIPTION OF THE INVENTION

The present invention will hereinafter be described in detail.

Figure 1:
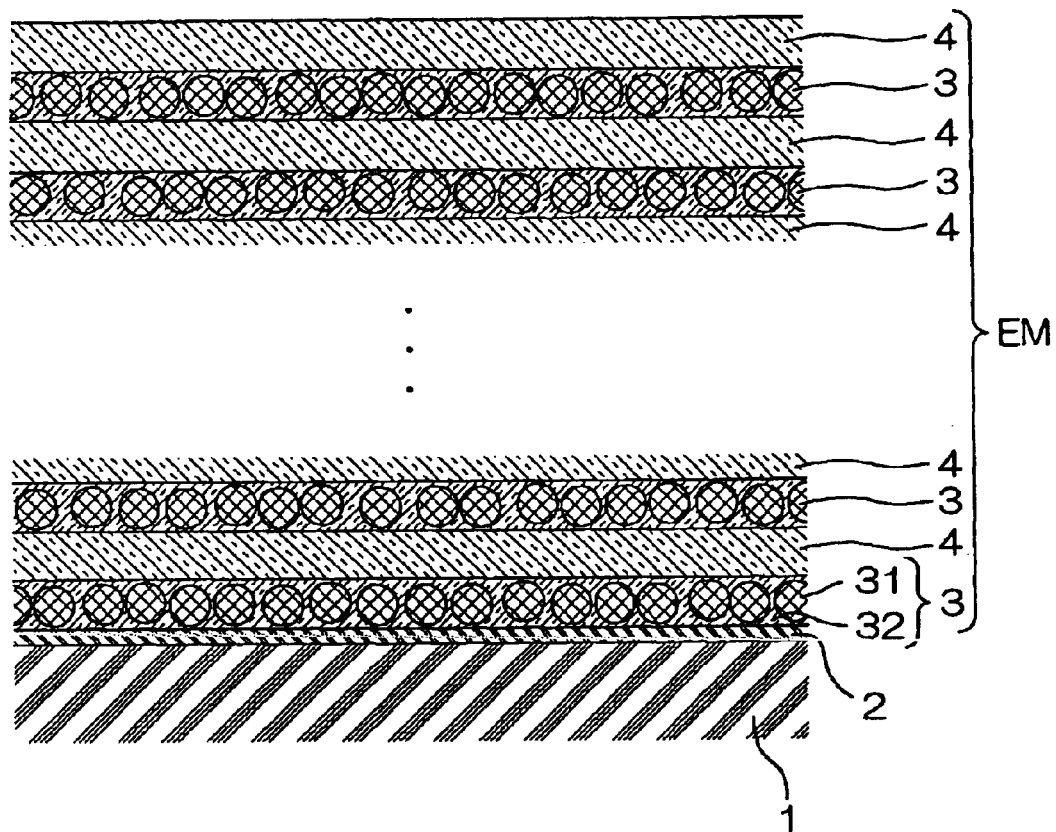
FIG. 1 is an enlarged sectional view illustrating a board for printed wiring according to one embodiment of the present invention.

FIG. 1 is an enlarged sectional view illustrating a board for printed wiring according to one embodiment of the present invention.

As shown, the board for printed wiring according to this embodiment includes an adhesive layer 2 of a metal oxide provided on a surface of a substrate 1; and an electromagnetic wave absorbing laminate EM provided on the adhesive layer 2, and comprising (a) magnetic layers 3 each comprising a plurality of magnetic particles 31 having an average particle diameter of 1 to 150 nm and isolated from each other by an electrically insulative material 32 and (b) electrically insulative layers 4, the magnetic layers 3 and the electrically insulative layers 4 being alternately stacked into a multi-layer structure having at least two layers.

In FIG. 1, two magnetic layers 3 and two electrically insulative layers 4 provided directly on the adhesive layer 2, and two magnetic layers 3 and three electrically insulative layers 4 provided in the uppermost portion of the electromagnetic wave absorbing laminate EM are merely illustrated, but nothing is illustrated in a space between the lowermost portion and the uppermost portion. However, it is needless to say that magnetic layers 3 and electrically insulative layers 4 are alternately stacked in this space.

Substrate

Usable as the substrate 1 are substrates composed of any of various materials conventionally known to be employed for printed wiring boards and having any of various configurations and structures.

Exemplary substrates mainly composed of a resin include single layer films and sheets composed of the resin, laminates prepared by stacking a fiber reinforced layer on any of the films and sheets, composite substrates prepared by dispersing reinforcement fibers in the resin, and composite substrates coated with the resin. A shield layer of a metal such as a stainless steel may be provided on a surface of the substrate 1.

Any of various resins conventionally known may be employed as the resin for the substrate 1. Examples of the resin particularly preferred for improvement of heat resistance, weather resistance, chemical resistance and mechanical strength include polyimides (wholly aromatic polyimides, polyetherimides, polymaleimideamines and the like), polyethylene naphthalates, polyamideimides, polyethylene terephthalates, aromatic polyamides, liquid crystal polyesters and epoxy resins.

The electromagnetic wave absorbing laminate EM can be formed on the resin surface of the substrate 1 or the metal surface such as of the shield layer formed on the surface of the substrate 1. In either case, the electromagnetic wave absorbing laminate EM is formed on the resin or metal surface with the intervention of the adhesive layer 2 and, hence, has high adhesion to the substrate 1.

The surface of the substrate 1 on which the electromagnetic wave absorbing laminate EM is formed with the intervention of the adhesive layer 2 may be pretreated through a plasma process or a surface roughening process for improvement of the adhesion of the adhesive layer 2.

Adhesive Layer

As described above, the adhesive layer 2 is composed of the metal oxide, particularly preferably a Ti containing metal oxide. Examples of the Ti containing metal oxide include titania (titanium oxide), compound oxides of Ti and other metals, and mixtures of any of these compound oxides and oxides and other metal oxides.

The adhesive layer 2 may be formed, for example, by a reactive sputtering method or a reactive ion plating method. From the industrial viewpoint such as of productivity and production costs, the formation of the adhesive layer 2 is preferably achieved by a so-called sol-gel method.

In the sol-gel method, a sol liquid is prepared by hydrolyzing at least a Ti containing metal alkoxide as a source of the metal oxide for the adhesive layer 2, and applied onto the surface of the substrate 1 to be formed with the electromagnetic wave absorbing laminate EM by any of various coating methods. This is followed by heating for dehydration and for promotion of generation of the metal oxide by evaporation of water. Thus, the adhesive layer 2 of the predetermined metal oxide can be formed.

The adhesive layer 2 preferably has a thickness of about 3 to 150 nm. This is based on the aforesaid ground.

Magnetic Layers

The magnetic layers 3 of the electromagnetic wave absorbing laminate EM provided on the adhesive layer 2 each contain the plurality of magnetic particles 31 electrically isolated from each other by the electrically insulative material 32.

Magnetic Particles

The magnetic particles 31 may be composed of any of various magnetic materials. In order to increase the saturation magnetic flux density of the magnetic layers 3 for further improvement of the electromagnetic wave absorbing characteristic of the magnetic layers, as described above, the magnetic particles 31 are preferably composed of at least one metal selected from the group consisting of Fe, Co and Ni, or the oxide of the metal. Among these, a permalloy (Fe—Ni alloy) and ferrite (Fe oxide) are particularly preferred. Thus, the magnetic layers 3 each have a saturation magnetic flux density of not smaller than 0.5 T to provide an excellent electromagnetic wave absorbing characteristic, though depending on the density of the magnetic particles 31 in the magnetic layers 3.

The magnetic particles 31 are required to have an average particle diameter of 1 to 150 nm. This is based on the aforesaid ground. More specifically, if the average particle diameter of the magnetic particles 31 is greater than 150 nm, the electrical resistivity is reduced to the level of the intrinsic resistivity of the magnetic material for the magnetic particles 31 (on the order of $\mu\Omega$cm). Therefore, if an inductive current occurs in the magnetic particles 31 due to a high frequency magnetic field and electric field, it is impossible to damp the magnetism occurring due to the high frequency. Hence, the magnetic layers fail to efficiently absorb and attenuate the electromagnetic waves.

On the other hand, if the average particle diameter of the magnetic particles 31 is smaller than 1 nm, the electrical resistivity is infinitely increased because the particle diameter is close to the mean free path of electrons. However, the magnetism is drastically reduced, so that the function as the magnetic material may be lost. Therefore, the average particle diameter of the magnetic particles should be 1 to 150 nm.

The magnetic particles 31 can be prepared by any of various preparation methods conventionally known, but preferably by a reduction precipitation method. In the reduction precipitation method, the magnetic particles 31 are precipitated in an aqueous solution containing ions of one or two or more metals as a source of the magnetic particles 31 by reducing the metal ions in the aqueous solution with the use of a reducing agent.

The magnetic particles 31 prepared by the reduction precipitation method have uniform particle diameters with a sharp particle size distribution.

The frequency characteristic of the electromagnetic wave absorbing laminate EM depends on the diameters of the magnetic particles 31. If the magnetic particles 31 have a broad particle size distribution, the frequency characteristics of the respective magnetic particles are averaged. Therefore, the electromagnetic wave absorbing laminate has a broad frequency distribution over a wide frequency range without a sharp peek at a predetermined electromagnetic wave frequency. Hence, the absorption efficiency for the electromagnetic waves at the predetermined frequency is reduced.

On the contrary, where the magnetic particles 31 prepared by the reduction precipitation method and hence having a sharp particle size distribution are employed, the electromagnetic wave absorbing laminate EM has a frequency distribution with a sharp peek at the predetermined electromagnetic wave frequency. Therefore, the absorption efficiency for the electromagnetic waves at the predetermined frequency is improved.

Trivalent titanium ions ($Ti^{3+}$) are preferably employed as the reducing agent in the reduction precipitation method.

Where the trivalent titanium ions are employed as the reducing agent, tetravalent titanium ions resulting from oxidation of the trivalent titanium ions in the aqueous solution are electrically reduced into trivalent titanium ions after the preparation of the magnetic particles 31 for repeated regeneration of the aqueous solution. Thus, the aqueous solution can advantageously be reused for the preparation of the magnetic particles 31.

In the reduction precipitation method employing the trivalent titanium ions as the reducing agent, the preparation of the magnetic particles is preferably achieved by electrolyzing an aqueous solution containing a tetravalent titanium compound such as titanium tetrachloride to partly reduce the tetravalent titanium ions into trivalent titanium ions for preparation of a reducing agent aqueous solution and then mixing the reducing agent aqueous solution with an aqueous solution (reaction liquid) containing ions of a source metal for the magnetic particles. Thus, the metal ions are reduced through a reducing reaction occurring when the trivalent titanium ions are oxidized into the tetravalent titanium ions, whereby the magnetic particles are precipitated.

In this method, the tetravalent titanium ions present in the solution system function as a growth suppressor for suppressing the growth of the magnetic particles 31 during the reduction precipitation.

In the reducing agent aqueous solution, some of the trivalent titanium ions and the tetravalent titanium ions are clustered in the form of a hydrated complex. In each cluster, the trivalent titanium ions having the function of growing the magnetic particles 31 and the tetravalent titanium ions having the function of suppressing the growth of the magnetic particles 31 act on each of the magnetic particles 31 in the preparation of the magnetic particles 31.

Thus, the magnetic fine particles 31 having an average particle diameter of not greater than 150 nm can easily be prepared.

In addition, this preparation method can control the ratio of the trivalent titanium ions to the tetravalent titanium ions in the reducing agent aqueous solution by adjusting electrolysis conditions to change the extents of the contradictory functions of the trivalent titanium ions and the tetravalent titanium ions in the clusters. Thus, the magnetic particles 31 to be prepared can be controlled as having any desired diameters.

Composite Particles

Figure 2:
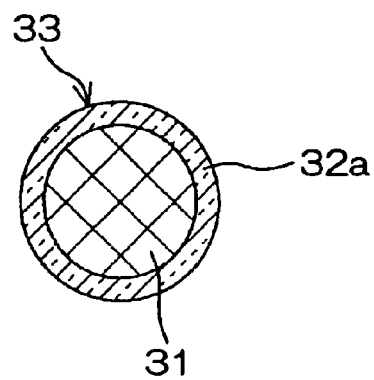
FIG. 2 is an enlarged sectional view of a composite particle to be contained in a magnetic layer of the board for printed wiring and including a magnetic particle.

The magnetic layers 3 each containing the plurality of magnetic particles 31 electrically isolated from each other by the electrically insulative material 32 can be formed by any of various methods. In order to assuredly isolate the magnetic particles 31 from each other, a plurality of composite particles 33 each having a composite structure (FIG. 2) are preferably prepared by coating the magnetic particles 31 with electrically insulative films 32a, and bonded to be unified for the formation of the magnetic layer 3.

The electrically insulative films 32a respectively covering the magnetic particles 31 in the magnetic layer 3 having the aforesaid structure are preferably composed of a metal oxide, an amine derivative, an alkanethiol derivative or a resin.

An oxide of at least one metal selected from the group consisting of Si, Al, Ti and Zr may be used as the metal oxide. More specific examples of the metal oxide include silica, alumina, titania and zirconia, compound oxides of two or more of the aforesaid four metals, and mixtures of two or more of these oxides and compound oxides.

From the industrial viewpoint such as of productivity and production costs, it is preferred to employ a sol-gel method for formation of the electrically insulative films 32a of the metal oxide like the formation of the adhesive layer 2.

In the sol-gel method, a sol liquid is prepared by hydrolyzing an alkoxide of a metal as a source of the metal oxide for the electrically insulative films 32a, and the magnetic particles 31 are dispersed in the sol liquid.

Then, the resulting dispersion is sprayed and dried in an atmosphere at a predetermined temperature by a spray drier, whereby surfaces of the magnetic particles 31 are dehydrated. At the same time, the generation of the metal oxide is promoted by evaporation of water. Thus, the electrically insulative films 32a of the predetermined metal oxide can be formed.

Alternatively, any of various conventionally known particle coating methods such as a fluid bed method may be employed for coating the magnetic particles 31 with the sol liquid to provide the metal oxide for the formation of the electrically insulative films 32a.

Examples of the amine derivative include hexaethylenediamine and octylamine.

The electrically insulative films 32a of the amine derivative can be formed by treating the magnetic particles 31 with the amine derivative. More specifically, the magnetic particles 31 are homogeneously mixed with the amine derivative and a solvent (mainly an alcohol or the like) by means of a particle processing machine such as an attritor or a homogenizer. Thus, N atoms of amino groups in the amine derivative are bonded to metal atoms in the surfaces of the magnetic particles 31, whereby the electrically insulative films 32a of the amine derivative are formed.

Examples of the alkanethiol derivative include alkanethiol compounds, such as n-dodecanethiol, n-hexadecanethiol, n-octadecanethiol and n-eicosanethiol, having 10 to 20 carbon atoms.

The electrically insulative films 32a of the alkanethiol derivative can be formed in substantially the same manner as described above. That is, the magnetic particles 31 are homogeneously mixed with the alkanethiol derivative and a solvent (mainly an alcohol or the like) by a particle processing machine such as an attritor or a homogenizer. Thus, S atoms of thiol groups in the alkanethiol derivative are bonded to metal atoms in the surfaces of the magnetic particles 31, whereby the electrically insulative films 32a are each formed as a monomolecular film of the alkanethiol derivative.

The amount of the amine derivative or the alkanethiol derivative to be added is determined so as to ensure uniform treatment of the surfaces of the magnetic particles with the derivative. Where the magnetic particles have a total weight×(g) and an average particle diameter y(nm), it is preferred that the amount of the derivative to be added is in the range of 0.6×(g) to 1.4×(g) if the average particle diameter y is not smaller than 100 nm, and is in the range of (400/y)×0.6×(g) to (400/y)×1.4×(g) if the average particle diameter y is smaller than 100 nm.

Further, any of various electrically insulative resins may be employed as the resin.

The formation of the electrically insulative films 32a of the resin may be achieved by coating the magnetic particles 31 with a resin solution and then drying the resulting magnetic particles 31 by means of a spray drier or a fluid bed method as described above.

However, it is preferred, from the industrial viewpoint such as of productivity and production costs, that a water soluble resin such as polyvinyl pyrrolidone is preliminarily dissolved in the reaction liquid which is to be used for the preparation of the magnetic particles 31 by the aforesaid reduction precipitation method, and the magnetic particles 31 are coated with the resin simultaneously with the precipitation thereof by the reducing reaction.

In the composite particles 33 having a composite structure with the magnetic particles 31 covered with the electrically insulative films 32a of any of the aforesaid materials, the electrically insulative films 32a preferably have a covering ratio of 10 to 50 vol %. This is based on the aforesaid ground.

The covering ratio can be determined from the following equation:

$$\text{Covering ratio}(\%) = \frac{\text{Volume of Electrically Insulative Films } 32a}{\text{Volume of Composite Particles } 33} \times 100$$

Formation of Magnetic Layer

For the formation of the magnetic layer 3 by employing the composite particles 33, the composite particles 33 are dispersed in a proper dispersing medium, and a binder of a resin soluble in the dispersing medium is added to the dispersing medium for preparation of a coating liquid for the magnetic layer.

The coating liquid is applied by a coating method such as a spray coating method and then heated, whereby the dispersing medium is dried and removed and the plurality of composite particles 33 are unitarily bound by the binder. Thus, the magnetic layer 3 is formed.

Where the composite particles 33 respectively having the electrically insulative films 32a of the resin are employed, a poor solvent for the resin is preferably used as the dispersing medium for prevention of exposure of the magnetic particles 31 which may otherwise occur due to dissolution of the resin.

By controlling the coating conditions in this coating method, particularly in the spray coating method, the magnetic layer 3 can be formed as having a structure such that the plurality of magnetic particles 31 are distributed within a plane without overlapping in the direction of the thickness of the layer as shown in FIG. 1.

The method for the formation of the magnetic layer 3 is not limited to the aforesaid method, but any other methods may be employed which can form the magnetic layer 3 structured so that the plurality of magnetic particles 31 are contained therein as electrically isolated from each other by the electrically insulative material 32.

Another method for the formation of the magnetic layer is such that a plurality of magnetic particles 31 and particles of an electrically insulative inorganic material 32 for the isolation of the magnetic particles 31 are alternately grown by employing a sputtering method.

In this method, a target as a source material for the magnetic particles 31 and a target as a source of the electrically insulative material 32 are set in a chamber of a sputtering machine. The internal pressure of the chamber is set at a higher level, and the substrate is spaced a greater distance from the targets, as compared with the case of continuous film formation.

Under such conditions, the sputtering of the magnetic material and the sputtering of the electrically insulative material are alternately and repeatedly performed for very short periods so as not to form continuous films. Thus, the plurality of magnetic particles 31 and the particles of the electrically insulative inorganic material 32 for the isolation of the magnetic particles 31 are alternately grown to form the magnetic layer 3.

In this sputtering method, the sputtering of the magnetic material is carried out only once to form the magnetic layer 3 so that the plurality of magnetic particles 31 are distributed within the plane without overlapping in the direction of the thickness of the layer.

The thickness of the magnetic layer 3 is not particularly limited.

In order to reduce the thickness of the entire electromagnetic wave absorbing laminate EM as much as possible, the magnetic layer 3 is preferably formed so that the plurality of magnetic particles 31 are distributed within the plane without overlapping in the direction of the thickness of the layer. In this case, the thickness of the magnetic layer 3 is slightly greater than the diameters of the magnetic particles 31 dispersed in the magnetic layer 3. More specifically, the thickness of the magnetic layer 3 can be reduced to not greater than about 250 nm even with the thickness of the electrically insulative film 32a taken into account, because the average particle diameter of the magnetic particles 31 is limited to 1 to 150 nm.

Electrically Insulative Layers

The electrically insulative layers 4 stacked in alternate relation with the magnetic layers 3 to form the electromagnetic wave absorbing laminate EM are preferably composed of a metal oxide or a curable resin.

The metal oxide is the oxide of at least one metal selected from the group consisting of Si, Al, Ti and Zr like the electrically insulative films 32a of the composite particles. More specific examples of the metal oxide include silica, alumina, titania and zirconia, compound oxides of two or more of these four metals, and mixtures of two or more of these oxides and compound oxides.

From the industrial viewpoints such as of productivity and production costs, a sol-gel method is preferably employed for the formation of the electrically insulative layer.

In the sol-gel method, an alkoxide of a metal as a source of the metal oxide for the electrically insulative layers 4 is hydrolyzed for preparation of a sol liquid. The sol liquid is applied by any of various coating method, and then heated for dehydration and for promotion of generation of the metal oxide by evaporation of water. Thus, the electrically insulative layer 4 of the predetermined metal oxide is formed.

Examples of the curable resin include various conventionally known thermosetting resins and photosetting resins which are curable by irradiation with light such as ultraviolet radiation. Particularly, the photosetting resins are preferred, because they are curable without high temperature heating which may affect the dispersion state of the magnetic particles 31 in the magnetic layer 3.

For the formation of the electrically insulative layer 4 of a photosetting resin, a liquid photosetting resin is applied by any of various coating methods, and then cured through a photosetting reaction by irradiation with light such as ultraviolet radiation.

The electrically insulative layer 4 preferably has a thickness sufficient to electrically isolate magnetic particles 31 in magnetic layers 3 disposed on the upper and lower sides of the electrically insulative layer as described above, further preferably a thickness of 1 to 50 nm.

Electromagnetic Wave Absorbing Laminate

The electromagnetic wave absorbing laminate EM can be formed by stacking two or more magnetic layers 3 and two or more electrically insulative layers 4 as described above in alternating relation on the adhesive layer 2.

The formation order of the magnetic layers 3 and the electrically insulative layers 4 is not particularly limited. In consideration of the function of the electrically insulative layers 4, the electrically insulative layers 4 preferably each intervene between upper and lower magnetic layers 3.

Therefore, it is preferred that a magnetic layer 3 is first formed on the adhesive layer 2 and then electrically insulative layers 4 and magnetic layers 3 are formed in alternating relation thereon.

The electromagnetic wave absorbing laminate EM may be of a double layer structure having one magnetic layer 3 and one electrically insulative layer 4. In order to ensure the effect of the laminate structure, however, the electromagnetic wave absorbing laminate EM preferably includes two or more magnetic layers 3. The uppermost layer of the laminate structure is preferably an electrically insulative layer 4 as shown in FIG. 1 for isolation from the external environment. Therefore, the electromagnetic wave absorbing laminate EM preferably has a four or more layer structure which includes magnetic layers 3 and electrically insulative layers 4 stacked in alternating relation in this order on the adhesive layer 2.

The upper limit of the number of the layers of the electromagnetic wave absorbing laminate EM is not particularly limited. As the number of the layers is increased, the electromagnetic wave absorbing characteristic is improved.

However, if the number of the layers is excessively great, the productivity of the electromagnetic wave absorbing laminate EM and hence the productivity of the board for printed wiring are reduced to increase the production costs. With the excessively great number of layers, the electromagnetic wave absorbing laminate EM suffers from an increased internal stress and, hence, is susceptible to distortion and cracking. Further, the total thickness of the electromagnetic wave absorbing laminate EM is increased, so that the space saving effect cannot be provided.

Therefore, the total number of the magnetic layers 3 and the electrically insulative layers 4 is preferably not greater than 20, more preferably not greater than 16.

The electromagnetic wave absorbing laminate EM may be formed as entirely or partly covering a surface of the substrate 1 opposite from a circuit formation surface, or in a formation area on the circuit formation surface of the substrate 1. Alternatively, the adhesive layer 2 may be formed on the circuit formation surface of the substrate 1 directly or with the intervention of an insulative layer, and the electromagnetic wave absorbing laminate EM may be formed on the adhesive layer 2.

One or two or more substrates may additionally be provided on the electromagnetic wave absorbing laminate EM formed on the substrate 1 to provide a multi-level board. In this case, the electromagnetic wave absorbing laminate EM is preferably configured so as to evade through-holes provided for connection of circuits disposed on the respective substrates.

As described above, the board for printed wiring having the electromagnetic wave absorbing laminate EM is effective for the EMI measures against the electromagnetic waves in a high frequency band of not lower than gigahertz.

Where the real part $\mu'$ and the imaginary part $\mu''$ of the complex permeability $\mu$ of the electromagnetic wave absorbing laminate EM satisfy a relationship $\mu' => \mu''$ in a predetermined frequency range of a device within a high frequency band up to 2 GHz, the board for printed wiring is effective not only for the EMI measures but also for the SAR measures.

Figure 3:
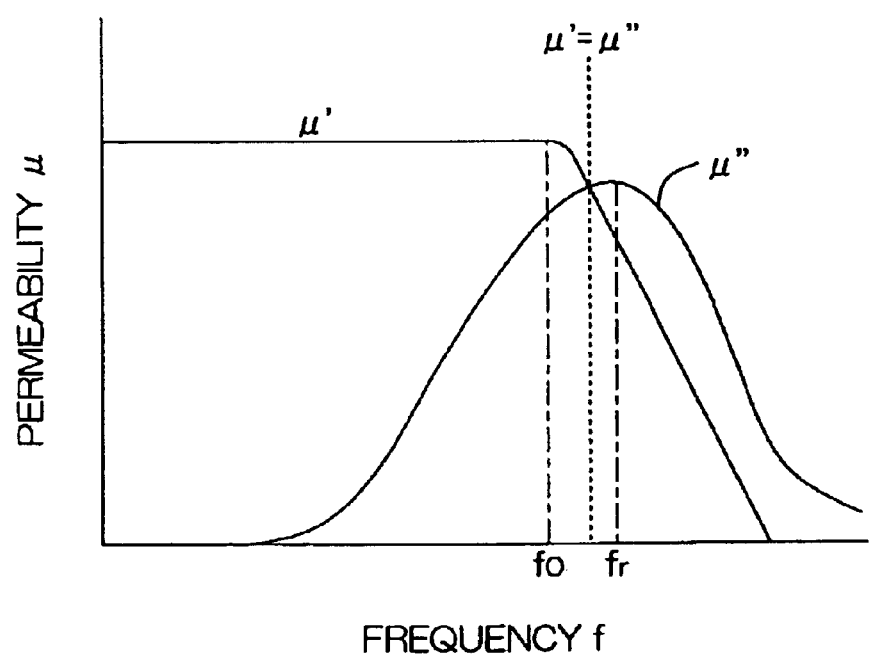
FIG. 3 is a graph illustrating a relationship between a frequency f and a complex permeability $\mu$ of a magnetic material.

The magnetic material experiences such a physical phenomenon that the real part $\mu'$ no longer follows a high frequency magnetic field but starts reducing if the frequency f exceeds a predetermined level $f_0$ as shown in FIG. 3. On the other hand, the imaginary part $\mu''$ is drastically increased to have a peak at a frequency $f_r$. The frequency $f_r$ is called a magnetic resonance frequency.

The frequencies $f_0$ and $f_r$ can be changed by controlling the anisotropic magnetic field $H_a$ of the magnetic particles dispersed in the magnetic layers.

That is, the magnetic resonance frequency $f_r$ of the magnetic material and the anisotropic magnetic field $H_a$ have a relationship represented by the following equation:

$$f_r = \nu H_a / 2\pi$$

wherein $\nu$ is a gyromagnetic constant and $\pi$ is a ratio of the circumference of a circle to its diameter. Therefore, the magnetic resonance frequency $f_r$ can be increased by increasing the anisotropic magnetic field $H_a$. Correspondingly, the frequency $f_0$ can also be increased. Thus, a frequency at which the real part $\mu'$ is equalized with the imaginary part $\mu''$ as indicated by a broken line in FIG. 3 can be changed. That is, the frequencies $f_0$ and $f_r$ and the frequency indicated by the broken line can be moved along the abscissa.

Therefore, the frequencies $f_0$ and $f_r$ are controlled to move the broken line so that the predetermined frequency range of the device in the high frequency band up to 2 GHz for the SAR measures falls within a range represented by an expression $\mu' > \mu''$ on the left side of the broken line (exclusive of the broken line). Thus, the electromagnetic wave absorbing laminate EM is effective for the SAR measures against the high frequency radiation in the aforesaid predetermined frequency range.

In order to change the anisotropic magnetic field $H_a$, the composition, shape and crystal structure of the magnetic particles 31 may be changed, or the intensity of the external magnetic field may be controlled in the preparation of the magnetic particles 31.

EXAMPLES

The present invention will hereinafter be described by way of examples and comparative examples. In Examples 1 to 7 and 9, the following composite particles (i) to (vi) were employed for formation of a magnetic layer.
Composite Particles (i)
Preparation of Reducing Agent Aqueous Solution A 20% hydrochloric acid aqueous solution containing titanium tetrachloride was prepared. The amount of titanium tetrachloride was determined so that trivalent titanium ions and tetravalent titanium ions were present at a total molar concentration of 0.2 mol/L in a solution mixture prepared by mixing a reaction liquid to be described later and a reducing agent aqueous solution obtained by cathodic electrolysis of the aqueous solution in the subsequent step in a predetermined ratio and adding a pH adjuster and, as required, deionized water to the resulting mixture. The resulting solution had a pH of 4.

In turn, the aqueous solution was poured in one of two chambers of an electrolysis bath partitioned by an anion exchange membrane available from Asahi Glass Co., Ltd. Further, a 0.1 mol/L sodium sulfate aqueous solution was poured in the other chamber of the electrolysis bath.

Then, carbon felt electrodes were immersed in the respective solutions, and a 3.5V direct current was applied between a cathode on the side of the titanium tetrachloride aqueous solution and an anode on the side of the sodium sulfate aqueous solution under constant voltage control. Thus, the titanium tetrachloride aqueous solution was subjected to the cathodic electrolysis for preparation of a reducing agent aqueous solution.

Through the cathodic electrolysis, about 60% of the tetravalent titanium ions were reduced into trivalent titanium ions in the reducing agent aqueous solution, and the resulting solution had a pH of 1.
Preparation of Reaction Liquid Nickel chloride, iron sulfate and trisodium citrate were dissolved in deionized water, and polyvinyl pyrrolidone was added to the resulting solution for preparation of a reaction liquid. The reaction liquid contained 0.04 mol/L of nickel chloride, 0.12 mol/L of iron sulfate and 0.3 mol/L of trisodium citrate based on the total amount of the aforesaid solution mixture. The amount of polyvinyl pyrrolidone was 10 vol % based on the total amount of metals (Ni and Fe) in the respective compounds.
Preparation of Composite Particles The reducing agent aqueous solution was put in a reaction vessel. While a liquid temperature was kept at 50° C., a saturated sodium carbonate aqueous solution was added as a pH adjuster to the reducing agent aqueous solution with stirring to adjust the pH of the reducing agent aqueous solution at pH 5.2. After the reaction liquid was gradually added to the reducing agent aqueous solution, deionized water was added to the aqueous solution as required. Thus, a predetermined amount of a solution mixture was prepared. The reaction liquid and the deionized water herein used were preliminarily heated at 50° C.

When the solution mixture was continuously stirred at 50° C. for several minutes, a powdery substance was precipitated. Immediately after the stirring was stopped, the powdery substance was filtered, rinsed and dried.

The resulting powdery substance had a composite structure such that magnetic particles were respectively coated with electrically insulative films of polyvinyl pyrrolidone.

The composition of the magnetic particles was analyzed by an ICP spectrometry, and it was confirmed that the magnetic particles were composed of a 52Ni-48Fe alloy.

Further, the average particle diameter of the magnetic particles was 60 nm when measured by a particle sizer (available from Malvern Instruments Ltd. under the trade name of Malvern HPPS) by means of a dynamic light scattering.

The covering ratio of the electrically insulative films was about 3 vol % as determined on the basis of the result of the measurement of specific gravity.
Composite Particles (ii)
Preparation of Reaction Liquid Cobalt chloride, iron sulfate and trisodium citrate were dissolved in deionized water, and then polyvinyl pyrrolidone was added to the resulting solution for preparation of a reaction liquid. The reaction liquid contained 0.04 mol/L of nickel cobalt, 0.04 mol/L of iron sulfate and 0.18 mol/L of trisodium citrate based on the total amount of the aforesaid solution mixture. The amount of polyvinyl pyrrolidone was 0.4 vol % based on the total amount of metals (Co and Fe) in the respective compounds.

Preparation of Composite Particles

A powdery substance was obtained in substantially the same manner as in the preparation of the composite particles (i), except that the reaction liquid prepared in the aforesaid manner was employed.

The resulting powdery substance had a composite structure such that magnetic particles were respectively coated with electrically insulative films of polyvinyl pyrrolidone.

The composition of the magnetic particles was analyzed by the ICP spectrometry, and it was confirmed that the magnetic particles were composed of a 52Co-48Fe alloy.

Further, the average particle diameter of the magnetic particles was 30 nm when measured by means of the aforesaid particle sizer.

The covering ratio of the electrically insulative films was about 1.0 vol % as determined on the basis of the result of the measurement of specific gravity.

Composite Particles (iii)

Preparation of Reaction Liquid

Cobalt chloride, nickel chloride and trisodium citrate were dissolved in deionized water for preparation of a reaction liquid. The reaction liquid contained 0.01 mol/L of nickel cobalt, 0.03 mol/L of nickel chloride and 0.1 mol/L of trisodium citrate based on the total amount of the aforesaid solution mixture.

Preparation of Magnetic Particles

Bare magnetic particles not coated with an electrically insulative film was prepared in substantially the same manner as in the preparation of the composite particles (i), except that the reaction liquid prepared in the aforesaid manner was employed.

The composition of the magnetic particles was analyzed by the ICP spectrometry, and it was confirmed that the magnetic particles were composed of a 80Co-20Fe alloy.

Further, the average particle diameter of the magnetic particles was 100 nm when measured by means of the aforesaid particle sizer.

Preparation of Composite Particles

A mixture prepared by adding tetraethyl-o-silicate, water and nitric acid to isopropyl alcohol was refluxed for 15 minutes for hydrolysis. Thus, a silicon sol liquid was prepared. The silicon sol liquid contained 0.1 mol/L of tetraethyl-o-silicate and 0.3 mol/L of water based on the total amount of the mixture. The amount of the nitric acid added was several droplets per liter of the mixture.

In turn, the aforesaid magnetic particles were dispersed in the silicon sol liquid, and the resulting dispersion was sprayed and dried. Thus, a powdery substance was obtained. A drying temperature was 160° C.

The resulting powdery substance had a composite structure such that the magnetic particles of a cobalt-nickel alloy were respectively coated with electrically insulative films of silica.

The covering ratio of the electrically insulative films was about 30 vol % as determined on the basis of the result of the measurement of specific gravity.

Composite Particles (iv)

Commercially available manganese ferrite particles (having an average particle diameter of 150 nm) prepared by a gas phase method were employed as magnetic particles, and treated with n-octadecanethiol. Thus, a powdery substance was obtained.

The resulting powdery substance had a composite structure such that the manganese ferrite particles were respectively coated with electrically insulative monomolecular films of n-octadecanethiol.

The covering ratio of the electrically insulative films was about 20 vol % as determined on the basis of the result of the measurement of specific gravity.

Example 1

Substrate

A 50 μm thick polyimide sheet having one surface treated with oxygen plasma (at an output of 300 W) was prepared as a substrate.

Formation of Adhesive Layer

Ingredients shown in the following Table 1 were mixed and stirred in a 30% RH atmosphere for five hours for hydrolysis with moisture in air. Thus, a titanium sol liquid was prepared.

TABLE 1

| Ingredients | (g) |
| --- | --- |
| Isopropyl titanate | 284 |
| Isopropyl alcohol | 600 |
| 2-ethylhexanoic acid | 144 |

The polyimide sheet was immersed in the titanium sol liquid with the oxygen-plasma-treated surface thereof being exposed and with the other surface thereof being masked, and lifted at a rate of 0.5 cm/min. Thus, a titania sol treatment film having a thickness of about 10 nm was formed on the polyimide sheet.

The resulting polyimide sheet was heated in a constant temperature vessel at 150° C. for two hours, whereby the titania sol treatment film was dehydrated and generation of titania was promoted by evaporation of water. Thus, a titania adhesive film having a thickness of 10 nm was formed.

Formation of Magnetic Layer

The composite particles (i) were dispersed in p-xylene, and polyvinylidene fluoride was added as a binder to the resulting dispersion for preparation of a coating liquid for a magnetic layer. The coating liquid contained 4 wt % of polyvinylidene fluoride on a solid basis or based on the total amount of polyvinylidene fluoride and the composite particles (i).

In turn, the coating liquid was applied to a thickness of about 100 nm on the adhesive layer on the polyimide sheet by a spray coating method, and then heated in a constant temperature vessel at 180° C. for two hours so as to be dried and solidified. Thus, a magnetic layer having a thickness of 100 nm was formed on the adhesive layer. The magnetic layer had a structure such that the plurality of magnetic particles were distributed within a plane without overlapping in the direction of the thickness of the layer.

Formation of Electrically Insulative Layer

The polyimide sheet was immersed in a silicon sol liquid prepared in the same manner as in the preparation of the composite particles (iii), and then lifted at a rate of 0.5 cm/min, whereby a silica sol treatment film having a thickness of about 150 nm was formed on the magnetic layer.

The resulting polyimide sheet was heated in a constant temperature vessel at 150° C. for two hours, whereby the silica sol treatment film was dehydrated and the generation of silica was promoted by evaporation of water. Thus, an electrically insulative layer of silica having a thickness of 70 nm was formed.

Production of Printed Wiring Board

The formation of the magnetic layer and the formation of the electrically insulative layer were alternately repeated six times. Thus, a printed wiring board was produced, wherein an electromagnetic wave absorbing laminate having a 12-layer structure was formed on the oxygen-plasma-treated surface of the polyimide sheet substrate with the intervention of the titania adhesive layer.

Example 2

A printed wiring board including an electromagnetic wave absorbing laminate of a 12-layer structure formed on an oxygen-plasma-treated surface of a polyimide sheet substrate with the intervention of a silica/titania adhesive layer was produced in substantially the same manner as in Example 1, except that the adhesive layer was formed in the following manner.

Formation of Adhesive Layer

Ingredients shown in the following Table 2 were mixed and stirred in a 30% RH atmosphere for five hours for hydrolysis with moisture in air. Thus, a silicon/titanium sol liquid was prepared.

TABLE 2

| Ingredients | (g) |
| --- | --- |
| Isopropyl titanate | 100 |
| Tetrabutyl-o-silicate | 86 |
| Isopropyl alcohol | 600 |
| 2-ethylhexanoic acid | 144 |

The polyimide sheet was immersed in the silicon/titanium sol liquid with the oxygen-plasma-treated surface thereof being exposed and with the other surface thereof being masked, and then lifted at a rate of 1 cm/min. Thus, a silica/titania sol treatment film having a thickness of about 50 nm was formed on the polyimide sheet.

The resulting polyimide sheet was heated in a constant temperature vessel at 150° C. for two hours, whereby the silica/titania sol treatment film was dehydrated and the generation of silica/titania was promoted by evaporation of water. Thus, a silica/titania adhesive film having a thickness of 50 nm was formed.

Example 3

A printed wiring board including an electromagnetic wave absorbing laminate of a 12-layer structure formed on one surface of a substrate with the intervention of a titania adhesive layer was produced in substantially the same manner as in Example 1, except that a 500 µm thick glass epoxy substrate was used as a substrate and the surface of the glass epoxy substrate was not treated with oxygen plasma.

Example 4

A printed wiring board including an electromagnetic wave absorbing laminate of an 8-layer structure formed on an oxygen-plasma-treated surface of a polyimide sheet substrate with the intervention of a titania adhesive layer was produced in substantially the same manner as in Example 1, except that the electrically insulative layers were each formed in the following manner and the formation of the magnetic layer and the formation of the electrically insulative layer were alternately repeated four times.

Formation of Electrically Insulative Layer

The polyimide sheet was immersed in a UV-curable acrylic resin liquid having a viscosity of not higher than 0.02 Pa·s, and then lifted at a rate of 0.1 cm/min. Thus, a resin film having a thickness of about 160 nm was formed on the magnetic layer.

Then, the resin film was cured by irradiation with ultraviolet radiation. Thus, the electrically insulative layer having a thickness of 150 nm was formed.

Example 5

A printed wiring board including an electromagnetic wave absorbing laminate of a 12-layer structure formed on an oxygen-plasma-treated surface of a polyimide sheet substrate with the intervention of a titania adhesive layer was produced in substantially the same manner as in Example 1, except that the composite particles (ii) were blended instead of the composite particles (i) in the same amount in the coating liquid for the magnetic layers.

The magnetic layers each had a structure such that the plurality of magnetic particles were distributed within a plane without overlapping in the direction of the thickness of the layer. The magnetic layers each had a thickness of 400 nm.

Example 6

A printed wiring board including an electromagnetic wave absorbing laminate of a 12-layer structure formed on an oxygen-plasma-treated surface of a polyimide sheet substrate with the intervention of a titania adhesive layer was produced in substantially the same manner as in Example 1, except that the composite particles (iii) were blended instead of the composite particles (i) in the same amount in the coating liquid for the magnetic layers.

The magnetic layers each had a structure such that the plurality of magnetic particles were distributed within a plane without overlapping in the direction of the thickness of the layer. The magnetic layers each had a thickness of 600 nm.

Example 7

A printed wiring board including an electromagnetic wave absorbing laminate of a 12-layer structure formed on an oxygen-plasma-treated surface of a polyimide sheet substrate with the intervention of a titania adhesive layer was produced in substantially the same manner as in Example 1, except that the composite particles (iv) were blended instead of the composite particles (i) in the same amount in the coating liquid for the magnetic layers.

The magnetic layers each had a structure such that the plurality of magnetic particles were distributed within a plane without overlapping in the direction of the thickness of the layer. The magnetic layers each had a thickness of 800 nm.

Example 8

A printed wiring board including an electromagnetic wave absorbing laminate of an 8-layer structure formed on an oxygen-plasma-treated surface of a polyimide sheet substrate with the intervention of a titania adhesive layer was produced in substantially the same manner as in Example 1, except that the magnetic layers were each formed in the following manner and the formation of the magnetic layer and the formation of the electrically insulative layer were alternately repeated four times.

Formation of Magnetic Layer

Ferrite and silica were alternately deposited at a time interval of one second on the surface of the polyimide sheet substrate formed with the adhesive layer by an RF magnetron sputtering method. The sputtering conditions were such that the pressure of argon gas was 0.133 Pa and distances between the substrate and targets were not smaller than 20 cm.

Thus, the magnetic layer was provided on the adhesive layer not in the form of a continuous film but in such a state that ferrite particles having an average particle diameter of about 5 nm and silica particles having an average particle diameter of 2 nm were homogeneously distributed. The magnetic layer had a thickness of 60 nm.

Example 9

A printed wiring board including an electromagnetic wave absorbing laminate of a 12-layer structure formed on a non treated surface of a glass epoxy substrate with the intervention of a titania adhesive layer was produced in substantially the same manner as in Example 3, except that the composite particles (ii) were blended instead of the composite particles (i) in the same amount in the coating liquid for the magnetic layers.

The magnetic layers each had a structure such that the plurality of magnetic particles were distributed within a plane without overlapping in the direction of the thickness of the layer. The magnetic layers each had a thickness of 400 nm.

Comparative Example 1

50 parts by weight of flat particles of a 50Ni-50Fe alloy (obtained by sieving commercially available 1 $\mu$m thick flat particles by a 200 $\mu$m mesh) were prepared as magnetic particles, and mixed with 50 parts by weight of a polyvinyl chloride resin. The resulting mixture was melted, kneaded and formed into a sheet having a thickness of 0.5 mm.

A printed wiring board was produced by bonding the resulting sheet onto one surface of a 500 $\mu$m thick glass epoxy substrate as employed in Example 3 with the use of an adhesive.

The characteristics of the printed wiring boards produced in the respective examples and the comparative example were determined by a coaxial waveguide method employing a network analyzer. Then, a graph indicative of a relationship between the frequency (GHz) and the permeability $\mu$ was prepared for each of the printed wiring boards. On the basis of the graph, a frequency $f_0$ at which the real part $\mu'$ of the permeability $\mu$ starts reducing and a frequency $f_1$ at which the imaginary part $\mu''$ has a peak were determined, and the levels of the real part $\mu'$ and the imaginary part $\mu''$ at a frequency of 1.5 GHz were determined. The results are shown in Table 3.

TABLE 3

| | Frequency $f_0$ (GHz) | Frequency $f_1$ (GHz) | $\mu'$ level (1.5 GHz) | $\mu''$ level (1.5 GHz) |
|---|---|---|---|---|
| Example 1 | 1.1 | 4.3 | 600 | 8 |
| Example 2 | 1.3 | 4.4 | 610 | 10 |
| Example 3 | 1.2 | 3.8 | 580 | 10 |
| Example 4 | 1.2 | 3.8 | 510 | 11 |
| Example 5 | 1.3 | 4.4 | 720 | 10 |
| Example 6 | 1.5 | 2.1 | 350 | 36 |
| Example 7 | 1.5 | 1.2 | 120 | 28 |
| Example 8 | 1.3 | 3.7 | 540 | 8 |
| Example 9 | 1.4 | 3.9 | 600 | 13 |
| Comparative Example 1 | 0.9 | 1.0 | 2 | 6 |

As can be understood from Table 3, the printed wiring boards of Examples 1 to 9 each provided a permeability $\mu$ whose imaginary part $\mu''$ (magnetic loss term) was high (not smaller than 8) at a frequency of 1.5 GHz, and were more excellent in electromagnetic wave absorbing characteristic in a high frequency band of not lower than gigahertz than the printed wiring board of Comparative Example 1. Therefore, it was confirmed that the printed wiring boards of Examples 1 to 9 were effective for the EMI measures in the high frequency band.

Further, it was confirmed that the printed wiring boards of Examples 1 to 9 were effective for the SAR measures at and around the frequency of 1.5 GHz, because the real part $\mu'$ of the permeability $\mu$ was greater than the imaginary part $\mu''$ at the frequency of 1.5 GHz.

What is claimed is:

1. A board for printed wiring comprising:

a substrate;

an adhesive layer of a metal oxide provided on a surface of the substrate; and an electromagnetic wave absorbing laminate provided on the adhesive layer, and said electromagnetic wave absorbing laminate comprising:

(a) a magnetic layer with a thickness of not greater than 250 nm comprising a plurality of magnetic particles having an average particle diameter of 1 to 150 nm and isolated from each other by an electrically insulative material; and (b) an electrically insulative layer with thickness of 1 to 50 nm;

the magnetic layer and the electrically insulative layer being alternately stacked in a multi-layer structure having at least two layers of the magnetic layer.

2. A board for printed wiring as set forth in claim 1, wherein the magnetic particles are composed of at least one metal selected from the group consisting of Fe, Co and Ni or the oxide of said metal.

3. A board for printed wiring as set forth in claim 1, wherein the magnetic particles are respectively coated with electrically insulative films to provide a plurality of composite particles, and said composite particles are bound each other to constitute the magnetic layer.

4. A board for printed wiring as set forth in claim 3, wherein the electrically insulative films are composed of the oxide of at least one metal selected from the group consisting of Si, Al, Ti and Zr, an amine derivative, an alkanethiol derivative or a resin.

5. A board for printed wiring as set forth in claim 3, wherein the electrically insulative films have a covering ratio of 10 to 50 vol % based on the total amount of the composite particles.

6. A board for printed wiring as set forth in claim 3, wherein the plurality of composite particles are bound by a binder to constitute the magnetic layer.

7. A board for printed wiring as set forth in claim 1, wherein the adhesive layer is composed of at least a Ti containing metal oxide.

8. A board for printed wiring as set forth in claim 1, wherein the adhesive layer has a thickness of 3 to 150 nm.

9. A board for printed wiring as set forth in claim 1, wherein the electrically insulative layer is composed of the oxide of at least one metal selected from the group consisting of Si, Al, Ti and Zr, or a curable resin.

10. A board for printed wiring as set forth in claim 1, wherein the electromagnetic wave absorbing laminate has a complex permeability $\mu$ having a real part $\mu'$ and an imaginary part $\mu''$ which satisfy a relationship $\mu' > \mu''$ in a predetermined frequency range within a high frequency band up to 2 GHz.

* * * * *